(12) United States Patent
Inoue

(10) Patent No.: US 11,976,201 B2
(45) Date of Patent: May 7, 2024

(54) RESIN FILM AND ORGANIC ELECTROLUMINESCENT DEVICE

(71) Applicant: ZEON CORPORATION, Tokyo (JP)

(72) Inventor: Hiroyasu Inoue, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 809 days.

(21) Appl. No.: 16/966,000

(22) PCT Filed: Jan. 23, 2019

(86) PCT No.: PCT/JP2019/002071
§ 371 (c)(1),
(2) Date: Jul. 30, 2020

(87) PCT Pub. No.: WO2019/151079
PCT Pub. Date: Aug. 8, 2019

(65) Prior Publication Data
US 2021/0032490 A1    Feb. 4, 2021

(30) Foreign Application Priority Data

Jan. 31, 2018    (JP) ................. 2018-015581

(51) Int. Cl.
| | | |
|---|---|---|
| C09D 109/06 | (2006.01) | |
| C08F 8/42 | (2006.01) | |
| C08F 293/00 | (2006.01) | |
| C08K 3/22 | (2006.01) | |
| H10K 50/84 | (2023.01) | |
| H10K 85/10 | (2023.01) | |

(52) U.S. Cl.
CPC .............. *C09D 109/06* (2013.01); *C08F 8/42* (2013.01); *C08F 293/00* (2013.01); *H10K 50/846* (2023.02); *H10K 85/111* (2023.02); *H10K 85/151* (2023.02); *C08K 2003/2224* (2013.01); *C08K 2003/2227* (2013.01); *C08K 2003/2289* (2013.01); *C08K 2201/003* (2013.01); *C08K 2201/011* (2013.01)

(58) Field of Classification Search
CPC .. C09D 109/06; H10K 50/846; H10K 85/151; H10K 85/111; C08F 8/42; C08F 293/00; C08K 2003/2224; C08K 2003/2227; C08K 2003/2289; C08K 2201/003; C08K 2201/011
See application file for complete search history.

(56) References Cited

U.S. PATENT DOCUMENTS

| | | | |
|---|---|---|---|
| 5,206,301 | A | 4/1993 | Hattori et al. |
| 10,374,190 | B2 | 8/2019 | Tazaki et al. |
| 11,081,672 | B2 | 8/2021 | Inoue |
| 2005/0227114 | A1 | 10/2005 | Tanaka et al. |
| 2007/0152212 | A1* | 7/2007 | Cho ................ H10K 50/844 257/40 |
| 2009/0130029 | A1 | 5/2009 | Tamarkin et al. |
| 2014/0323669 | A1 | 10/2014 | Kageyama |
| 2015/0010652 | A1 | 1/2015 | Kurogi et al. |
| 2015/0048356 | A1 | 2/2015 | Lee et al. |
| 2015/0307758 | A1* | 10/2015 | Tazaki ............... H10K 50/8426 524/1 |
| 2016/0264429 | A1 | 9/2016 | Kurogi et al. |
| 2016/0343970 | A1 | 11/2016 | Tazaki et al. |
| 2017/0222183 | A1 | 8/2017 | Cho et al. |
| 2019/0006623 | A1 | 1/2019 | Inoue |
| 2019/0071553 | A1 | 3/2019 | Lee et al. |
| 2019/0152195 | A1* | 5/2019 | Inoue ................... C09J 11/06 |
| 2020/0172686 | A1 | 6/2020 | Inoue |
| 2021/0198475 | A1 | 7/2021 | Inoue |

FOREIGN PATENT DOCUMENTS

| | | |
|---|---|---|
| CN | 104471007 A | 3/2015 |
| CN | 105557068 A | 5/2016 |
| CN | 106415875 A | 2/2017 |
| EP | 3432690 A1 | 1/2019 |
| JP | H02133406 A | 5/1990 |
| JP | H02305814 A | 12/1990 |
| JP | H0372512 A | 3/1991 |
| JP | H0374409 A | 3/1991 |
| JP | 2003107214 A | 4/2003 |
| JP | 2004143311 A | 5/2004 |
| JP | 2005298598 A | 10/2005 |
| JP | 2006272190 A | 10/2006 |

(Continued)

OTHER PUBLICATIONS

Apr. 10, 2019, International Search Report issued in the International Patent Application No. PCT/JP2019/002071.
Apr. 23, 2019, International Search Report issued in the International Patent Application No. PCT/JP2019/002510.
Aug. 4, 2020, International Preliminary Report on Patentability issued in the International Patent Application No. PCT/JP2019/002510.
Feb. 13, 2023, Office Action issued by the United States Patent and Trademark Office in the U.S. Appl. No. 16/963,252.

(Continued)

*Primary Examiner* — Alicia J Weydemeyer
*Assistant Examiner* — Laura B Figg
(74) *Attorney, Agent, or Firm* — KENJA IP LAW PC

(57) ABSTRACT

Provided is a resin film including: a resin containing a polymer; a hygroscopic particle dispersed in the resin and having a primary particle diameter of 40 nm or more and 80 nm or less and a refractive index of 1.2 or more and 3.0 or less; and an organic solvent-soluble dispersant. Preferably the resin is a silicon-containing resin. Preferably the silicon-containing resin is a silicon-containing thermoplastic resin. Preferably the silicon-containing thermoplastic elastomer contains a graft polymer having a silicon-containing group as the polymer. An organic electroluminescent device including the resin film is also provided.

12 Claims, No Drawings

(56) References Cited

FOREIGN PATENT DOCUMENTS

| | | |
|---|---|---|
| JP | 2007100032 A | 4/2007 |
| JP | 2007184279 A | 7/2007 |
| JP | 2008069223 A | 3/2008 |
| JP | 2011001452 A | 1/2011 |
| JP | 2013182070 A | 9/2013 |
| JP | 2014172960 A | 9/2014 |
| JP | 2017065086 A | 4/2017 |
| JP | 2017513205 A | 5/2017 |
| JP | 2017117721 A | 6/2017 |
| JP | 2018100390 A | 6/2018 |
| KR | 1020100081136 A | 7/2010 |
| KR | 1020150112892 A | 10/2015 |
| TW | 201600544 A | 1/2016 |
| WO | 2013108731 A1 | 7/2013 |
| WO | 2013147284 A1 | 10/2013 |
| WO | 2014091941 A1 | 6/2014 |
| WO | 2015099079 A1 | 7/2015 |
| WO | 2017111138 A1 | 6/2017 |
| WO | 2017159589 A1 | 9/2017 |
| WO | 2018155311 A1 | 8/2018 |

OTHER PUBLICATIONS

Jiri George Drobny, 7—Polyolefin-Based Thermoplastic Elastomers, Handbook of Thermoplastic Elastomers, in Plastics Design Library, 2007, pp. 191-199. (Year: 2007).

Aug. 4, 2020, International Preliminary Report on Patentability issued in the International Patent Application No. PCT/JP2019/002071.

Jul. 11, 2023, Office Action issued by the United States Patent and Trademark Office in the United States U.S. Appl. No. 16/963,252.

\* cited by examiner

RESIN FILM AND ORGANIC ELECTROLUMINESCENT DEVICE

FIELD

The present invention relates to a resin film and an organic electroluminescent device including this resin film.

BACKGROUND

An electronic device such as an organic electroluminescent device (hereinafter, sometimes appropriately referred to as an "organic EL device") is sometimes required to include a constituent element for preventing the moisture intrusion into the device.

For example, an organic EL device may include a substrate plate such as a glass plate, and an electrode and a light-emitting layer that are disposed thereon. Since the electrode and light-emitting layer of the organic EL device deteriorate due to moisture intrusion, it is necessary to block the moisture intrusion into the light-emitting layer or the like. As a constituent element having such a function, a sealing film may be used. The sealing film to be used may be a film formed of a material containing a resin and a hygroscopic particle. Various sealing films and materials constituting the sealing films have been known (for example, Patent Literatures 1 to 4).

CITATION LIST

Patent Literature

Patent Literature 1: Japanese Patent Application Laid-Open No. 2017-117721 A
Patent Literature 2: International Publication No. 2017/111138
Patent Literature 3: International Publication No. 2013/108731 (publication corresponding thereto: U.S. Patent Application Publication No. 2014/323669)
Patent Literature 4: International Publication No. 2013/147284 (publication corresponding thereto: U.S. Patent Application Publication No. 2015/010652)

SUMMARY

Technical Problem

The sealing film is required not only to have sealing performance but also to be unharmful to the performance of an electronic device. For example, properties such as high transparency, a smooth surface with a small irregular shape, and low haze are required. Here, when a hygroscopic particle capable of suppressing the increase in haze of a film is used, film transparency and surface smoothness may be impaired in some cases. On the other hand, when a hygroscopic particle capable of enhancing film transparency and surface smoothness is used, haze may undesirably increase in some cases.

Therefore, an object of the present invention is to provide a resin film that can be used for use applications such as a sealing film in an electronic device such as an organic EL device, and has a combination of properties such as high transparency, high surface smoothness, and low haze.

A further object of the present invention is to provide an organic EL device with suppressed moisture intrusion to achieve high durability, and with a high-quality light exit surface.

Solution to Problem

The present inventor conducted studies for solving the foregoing problem. As a result, the present inventor has found that the foregoing problem can be solved by using, as a material constituting a resin film, a hygroscopic particle having a specific particle diameter and refractive index, together with a specific dispersant, and thus accomplished the present invention.

That is, the present invention is as follows.

<1> A resin film comprising: a resin containing a polymer; a hygroscopic particle dispersed in the resin and having a primary particle diameter of 40 nm or more and 80 nm or less and a refractive index of 1.2 or more and 3.0 or less; and an organic solvent-soluble dispersant.

<2> The resin film according to <1>, wherein the resin is a silicon-containing resin.

<3> The resin film according to <2>, wherein the silicon-containing resin is a silicon-containing thermoplastic resin.

<4> The resin film according to <3>, wherein the silicon-containing thermoplastic resin is a silicon-containing thermoplastic elastomer.

<5> The resin film according to <4>, wherein the silicon-containing thermoplastic elastomer contains a graft polymer having a silicon-containing group as the polymer.

<6> The resin film according to <5>, wherein the polymer has a structure obtained by graft polymerization of a monomer having a silicon-containing group and a copolymer selected from the group consisting of a styrene-butadiene block copolymer, a styrene-butadiene-styrene block copolymer, a styrene-isoprene block copolymer, a styrene-isoprene-styrene block copolymer, a hydrogenated product thereof, and a mixture thereof.

<7> The resin film according to any one of <1> to <6>, further comprising a plasticizer.

<8> The resin film according to any one of <1> to <7>, wherein the storage elastic modulus thereof at 25° C. is $10^7$ Pa or more and $10^9$ Pa or less.

<9> The resin film according to any one of <1> to <8>, wherein the thickness thereof is 0.1 μm or more and 1000 μm or less.

<10> The resin film according to any one of <1> to <9>, wherein the internal haze thereof is 5.0% or less.

<11> An organic electroluminescent device comprising the resin film according to any one of <1> to <10>.

Advantageous Effects of Invention

The resin film of the present invention is a resin film that can be used for use applications such as a sealing film in an electronic device such as an organic EL device, and can have a combination of properties such as high transparency, high surface smoothness, and low haze.

As the organic EL device of the present invention includes the resin film according to the present invention, the device can be with a suppressed moisture intrusion to achieve high durability, and can have a high-quality light exit surface.

DESCRIPTION OF EMBODIMENTS

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, "(meth)acryl" is a term that includes all of "acryl", "methacryl", and mixtures thereof, unless otherwise specified.

In the following description, for the sake of convenience, the term "solvent" is a term which is to be broadly understood, and includes not only a solution medium but also a dispersion medium.

1. Summary of Resin Film

The resin film of the present invention includes a resin, a hygroscopic particle dispersed in the resin, and a specific dispersant.

2. Resin

As the resin constituting the resin film of the present invention, a thermoplastic resin is preferable from the viewpoint of molding easiness. As such a thermoplastic resin, a thermoplastic elastomer is preferable from the viewpoint of facilitating molding and preventing breakage.

A thermoplastic elastomer refers to a material that exhibits rubber properties at normal temperature and can be plasticized and molded at high temperature. Such a thermoplastic elastomer is less likely to cause elongation and breakage when the applied load is small. Specifically, the thermoplastic elastomer exhibits a Young's modulus of 0.001 to 1 GPa and a tensile elongation (break elongation) of 100 to 1000% at 23° C. In the high temperature range of 40° C. or higher and 200° C. or lower, the storage elastic modulus of the thermoplastic elastomer rapidly decreases so that the loss tangent tan δ (loss modulus/storage elastic modulus) has a peak or exhibits a value more than 1, and the thermoplastic elastomer softens. The Young's modulus and tensile elongation may be measured in accordance with JIS K7113. The loss tangent tan δ may be measured by a commercially available dynamic viscoelasticity measuring device.

In general, the thermoplastic elastomer contains no or little, if any, residual solvent, and thus produces little outgas. Therefore, gas is less likely to occur under low pressure environment, and thereby the resin film itself can be prevented from being a gas generation source. In addition, a treatment for crosslinking is not necessary during the process, which is different from a thermosetting resin and a photocurable resin, and thereby the process can be simplified.

The resin is preferably a silicon-containing resin. When a silicon-containing resin is adopted as the resin, adhesion strength between the resin film and another member can be improved. When the resin film having such high adhesion strength is used as a sealing film, favorable durability and sealing performance can be obtained.

The silicon-containing resin is preferably a silicon-containing thermoplastic resin, more preferably a silicon-containing thermoplastic elastomer. With such a resin, the resin film can be easily molded, and breakage of the resin film can be suppressed. Further the resulting resin film can have high adhesion strength. Examples of the silicon-containing thermoplastic elastomer may include a resin containing, as the polymer, a graft polymer having a silicon-containing group. The detail of the graft polymer having a silicon-containing group will be described later.

2.1. Polymer

The resin contains a polymer. The polymer may serve as the main component of the resin.

Examples of the polymer may include an ethylene-α-olefin copolymer such as an ethylene-propylene copolymer; an ethylene-α-olefin-polyene copolymer; a copolymer of ethylene with an unsaturated carboxylic acid ester such as ethylene-methyl methacrylate and ethylene-butyl acrylate; a copolymer of ethylene with a vinyl fatty acid ester such as ethylene-vinyl acetate; a polymer of an alkyl acrylic acid ester such as ethyl acrylate, butyl acrylate, hexyl acrylate, 2-ethylhexyl acrylate, and lauryl acrylate; a diene-based copolymer such as a polybutadiene, a polyisoprene, an acrylonitrile-butadiene copolymer, a butadiene-isoprene copolymer, a butadiene-(meta)acrylic acid alkyl ester copolymer, a butadiene-(meta)acrylic acid alkyl ester-acrylonitrile copolymer, and a butadiene-(meta)acrylic acid alkyl ester-acrylonitrile-styrene copolymer; a butylene-isoprene copolymer; an aromatic vinyl compound-conjugated diene copolymer such as a styrene-butadiene random copolymer, a styrene-isoprene random copolymer, a styrene-butadiene block copolymer, a styrene-butadiene-styrene block copolymer, a styrene-isoprene block copolymer, and a styrene-isoprene-styrene block copolymer; a hydrogenated aromatic vinyl compound-conjugated diene copolymer such as a hydrogenated styrene-butadiene random copolymer, a hydrogenated styrene-isoprene random copolymer, a hydrogenated styrene-butadiene block copolymer, a hydrogenated styrene-butadiene-styrene block copolymer, a hydrogenated styrene-isoprene block copolymer, and a hydrogenated styrene-isoprene-styrene block copolymer; and a low crystallizable polybutadiene, a styrene graft ethylene-propylene elastomer, a thermoplastic polyester elastomer, and an ethylene-based ionomer. As the polymer, one type thereof may be solely used, and two or more types thereof may also be used in combination at any ratio.

As the polymer, a polymer selected from an aromatic vinyl compound-conjugated diene copolymer, a hydrogenated aromatic vinyl compound-conjugated diene copolymer, and a combination thereof is preferable for obtaining desired advantageous effects of the present invention.

As the aromatic vinyl compound-conjugated diene copolymer, an aromatic vinyl compound-conjugated diene block copolymer is preferable. The aromatic vinyl compound-conjugated diene block copolymer is preferably selected from a styrene-butadiene block copolymer, a styrene-butadiene-styrene block copolymer, a styrene-isoprene block copolymer, a styrene-isoprene-styrene block copolymer, and mixtures thereof.

A hydrogenated aromatic vinyl compound-conjugated diene copolymer is a hydrogenated product of an aromatic vinyl compound-conjugated diene copolymer. That is, the hydrogenated aromatic vinyl compound-conjugated diene copolymer has a structure obtained by hydrogenating part or all of the carbon-carbon unsaturated bonds in the main chain and the side chain of the aromatic vinyl compound-conjugated diene copolymer, the carbon-carbon bonds of the aromatic ring, or both of them. However, in the present application, the hydrogenated product is not limited by the producing method thereof.

The hydrogenation rate of the hydrogenated aromatic vinyl compound-conjugated diene copolymer is usually 90% or more, preferably 97% or more, and more preferably 99% or more. As the hydrogenation rate increases, heat resistance and light resistance of the resin can be improved.

Herein, the hydrogenation rate of the hydrogenated product may be obtained by measurement by $^1$H-NMR.

The hydrogenation rate of the carbon-carbon unsaturated bonds in the main chain and the side chain of the hydrogenated aromatic vinyl compound-conjugated diene copolymer is preferably 95% or more, and more preferably 99% or more. By increasing the hydrogenation rate of the carbon-carbon unsaturated bonds in the main chain and the side chain of the hydrogenated aromatic vinyl compound-conjugated diene copolymer, light resistance and oxidation resistance of the resin can further be increased.

The hydrogenation rate of the carbon-carbon unsaturated bonds of the aromatic ring of the hydrogenated aromatic vinyl compound-conjugated diene copolymer is preferably 90% or more, more preferably 93% or more, and particularly preferably 95% or more. By increasing the hydrogenation rate of the carbon-carbon unsaturated bonds of the aromatic ring, the glass transition temperature of the hydrogenated product is increased, so that heat resistance of the resin can be effectively increased. Furthermore, photoelastic coefficient of the resin can be lowered to reduce the occurrence of retardation when used as, for example, an adhesive layer.

As the hydrogenated aromatic vinyl compound-conjugated diene copolymer, a hydrogenated aromatic vinyl compound-conjugated diene block copolymer is preferable. The hydrogenated aromatic vinyl compound-conjugated diene block copolymer is preferably selected from a hydrogenated styrene-butadiene block copolymer, a hydrogenated styrene-butadiene-styrene block copolymer, a hydrogenated styrene-isoprene block copolymer, a hydrogenated styrene-isoprene-styrene block copolymer, and mixtures thereof. More specific examples of these may include those described in prior art documents such as Japanese Patent Application Laid-Open Nos. Hei. 2-133406 A, Hei. 2-305814 A, Hei. 3-72512 A and Hei. 3-74409 A, and International Publication No. 2015/099079.

As the hydrogenated aromatic vinyl compound-conjugated diene block copolymer, a copolymer having a structure obtained by hydrogenating both unsaturated bonds of a conjugated diene and an aromatic ring is preferable.

A particularly preferable block form of the hydrogenated aromatic vinyl compound-conjugated diene block copolymer is a triblock copolymer in which polymer blocks [A] of a hydrogenated product of an aromatic vinyl polymer are bonded to both ends of a polymer block [B] of a hydrogenated product of a conjugated diene polymer; or a pentablock copolymer in which the polymer blocks [B] are bonded to both ends of the polymer block [A], and the polymer blocks [A] are further bonded to the other ends of both the polymer blocks [B]. In particular, the triblock copolymer of [A]-[B]-[A] is particularly preferable because it can be easily produced and the properties as a thermoplastic elastomer can be kept within desired ranges.

In the hydrogenated aromatic vinyl compound-conjugated diene block copolymer, the ratio (wA/wB) of the weight fraction wA of the entire polymer block [A] in the entirety of the block copolymer relative to the weight fraction wB of the entire polymer block [B] in the entirety of the block copolymer is usually 20/80 or more, and preferably 30/70 or more, and is usually 60/40 or less, and preferably 55/45 or less. By setting the aforementioned ratio wA/wB to be equal to or more than the lower limit value of the aforementioned range, heat resistance of the resin can be improved. By setting the ratio to be equal to or less than the upper limit value, flexibility of the resin can be enhanced, and a barrier property of the resin can be stably and favorably maintained. Further, since the sealing temperature can be lowered by lowering the glass transition temperature of the block copolymer, when the resin film of the present invention is applied to an organic EL element, an organic semiconductor element, or the like, thermal degradation of the element can be suppressed. In addition, by setting the ratio (wA/wB) to fall within the aforementioned range, the temperature range in which the resin film has rubber-elasticity can be widened, and the temperature range in which the electronic device has flexibility can be widened.

2.2. Polymer: Polymer Having Polar Group

Further examples of the polymer that the resin may contain may include a polymer having a polar group. It is preferable that the resin contains as the polymer a polymer having a polar group. Since the resin contains a polymer having a polar group, adhesion between the resin film and devices can be improved. Examples of such polar groups may include a silicon-containing group such as an alkoxysilyl group, a carboxyl group, a carbonyl-containing group such as an acid anhydride group, and an epoxy group, an amino group and an isocyanate group. Among these, an alkoxysilyl group is preferable from the viewpoint of favorable adhesion with inorganic substances, particularly, inorganic substances containing Si such as glass and SiOx.

Examples of the polymer having a polar group may include a graft polymer having a polar group. Examples of the graft polymer having a polar group may include a graft polymer having a silicon-containing group.

Examples of the graft polymer having a polar group may include a graft polymer containing a polar group-containing unit. The polar group-containing unit is a unit having a structure obtained by polymerizing a monomer having a polar group. A graft polymer containing a polar group-containing unit is a polymer having a structure obtained by graft polymerization of a certain polymer and a monomer having a polar group. However, the polar group-containing unit and the graft polymer containing the polar group-containing unit are not limited by the producing methods thereof. Hereinafter, the polymer used for the reaction of such graft polymerization is referred to as a "pre-reaction polymer" in order to distinguish it from the polymer contained in the resin of the resin film of the present invention. Examples of the pre-reaction polymer may include the same polymers as those exemplified above as the polymers that may be employed as the main component of the resin.

Examples of the monomer having a polar group may include an ethylenic unsaturated silane compound having an alkoxysilyl group such as vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, p-styryltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, 3-acryloxypropyltriethoxysilane, and 2-norbornen-5-yltrimethoxysilane.

By reacting the pre-reaction polymer with a monomer having a polar group, a polar group can be introduced into the pre-reaction polymer to obtain a graft polymer containing a polar group-containing unit. When an alkoxysilyl group is introduced as a polar group, the amount of the alkoxysilyl group introduced is usually 0.1 part by weight or more, preferably 0.2 part by weight or more, and more preferably 0.3 part by weight or more, and is usually 10 parts by weight or less, preferably 5 parts by weight or less, and more preferably 3 parts by weight or less, relative to 100 parts by weight of the pre-reaction polymer. When the amount of the alkoxysilyl group introduced falls within the aforementioned range, it is possible to prevent excessive elevation of the degree of cross-linking between the alkoxysilyl groups decomposed by moisture or the like, so that adhesion property can be maintained at a high level. Examples of substances having an alkoxysilyl group used for introducing an alkoxysilyl group and modification methods may include those described in prior art documents such as International Publication No. 2015/099079.

The amount of the polar group introduced may be measured with $^1$H-NMR spectrum. When the amount of the polar group introduced is small, the number of times of integration during measurement of the amount of the polar group introduced may be increased.

Introduction of an alkoxysilyl group as a polar group into the pre-reaction polymer is called silane modification. In the process of silane modification, an alkoxysilyl group may be directly bonded to the pre-reaction polymer, or may be bonded thereto via a divalent organic group such as an alkylene group, for example. Hereinafter, the polymer obtained by silane modification of the pre-reaction polymer is also referred to as "silane-modified polymer".

The silane-modified polymer is preferably one or more polymers selected from a silane modified product of a hydrogenated styrene-butadiene block copolymer, a silane modified product of a hydrogenated styrene-butadiene-styrene block copolymer, a silane modified product of a hydrogenated styrene-isoprene block copolymer, and a silane modified product of a hydrogenated styrene-isoprene-styrene block copolymer.

The weight-average molecular weight (Mw) of the polymer constituting the resin is usually 20,000 or more, preferably 30,000 or more, and more preferably 35,000 or more, and is usually 200,000 or less, preferably 100,000 or less, and more preferably 70,000 or less. The weight-average molecular weight of the polymer may be measured as a polystyrene-equivalent value by gel permeation chromatography using tetrahydrofuran as a solvent. The molecular weight distribution (Mw/Mn) of the polymer is preferably 4 or less, more preferably 3 or less, and particularly preferably 2 or less, and is preferably 1 or more. By setting the weight-average molecular weight Mw and the molecular weight distribution Mw/Mn of the polymer to fall within the aforementioned ranges, mechanical strength and heat resistance of the resin can be improved.

The silane-modified polymer has excellent adhesion property to materials such as glass, an inorganic substance, and metal, for example. Therefore, when an element of an organic EL device is sealed by the resin film of the present invention, the adhesion between the resin film and the element can be particularly increased. Thus, even after exposure to a high-temperature and high-humidity environment usually performed in reliability evaluation of an organic EL device for a long period of time, the resin film can maintain sufficient adhesive strength.

2.3. Optional Component

The resin may contain optional components in addition to the polymer. Examples of the optional components may include a light stabilizer for improving weather resistance and heat resistance, an ultraviolet absorber, an antioxidant, a lubricant, and an inorganic filler. As the optional component, one type thereof may be solely used, and two or more types thereof may also be used in combination at any ratio.

Examples of the antioxidant may include a phosphorus-based antioxidant, a phenol-based antioxidant, and a sulfur-based antioxidant, and a phosphorus-based antioxidant is preferable because of low tendency to cause coloring.

Examples of the phosphorus-based antioxidant may include a monophosphite-based compound such as triphenylphosphite, diphenylisodecylphosphite, phenyldiisodecylphosphite, tris(nonylphenyl)phosphite, tris(dinonylphenyl)phosphite, tris(2,4-di-t-butylphenyl)phosphite, and 10-(3,5-di-t-butyl-4-hydroxybenzyl)-9,10-dihydro-9-oxa-10-phosphaphenanthrene-10-oxide; a diphosphite-based compound such as 4,4'-butylidene-bis(3-methyl-6-t-butylphenyl-di-tridecyl phosphite) and 4,4'-isopropylidene-bis (phenyl-di-alkyl (C12 to C15) phosphite); and compounds such as 6-[3-(3-t-butyl-4-hydroxy-5-methylphenyl)propoxy]-2,4,8,10-tetrakis-t-butyldibenzo[d,f][1.3.2]dioxaphosphepine, 6-[3-(3,5-di-t-butyl-4-hydroxyphenyl)propoxy]-2,4,8,10-tetrakis-t-butyldibenzo[d,f][1.3.2]dioxaphosphepine.

Examples of the phenol-based antioxidant may include compounds such as pentaerythrythyl.tetrakis[3-(3,5-di-t-butyl-4-hydroxyphenyl)propionate], 2,2-thio-diethylene bis [3-(3,5-di-butyl-4-hydroxyphenyl)propionate], octadecyl-3-(3,5-di-t-butyl-4-hydroxyphenyl)propionate, 3,9-bis{2-(3-t-butyl-4-hydroxy-5-methylphenyl)propionyloxy]-1,1-dimethylethyl }-2,4,8,10-tetraoxaspiro[5,5]undecane, and 1,3,5-trimethyl-2,4,6-tris(3,5-di-t-butyl-4-hydroxybenzyl)benzene.

Examples of the sulfur-based antioxidant may include compounds such as dilauryl-3,3'-thiodipropionate, dimyristyl-3,3'-thiodipropionate, distearyl-3,3'-thiodipropionate, laurylstearyl-3,3'-thiodipropionate, pentaerythritol-tetrakis-(β-lauryl-thio-propionate, and 3,9-bis(2-dodecylthioethyl)-2,4,8,10-tetraoxaspiro[5,5]undecane.

The amount of the antioxidant is usually 0.01 part by weight or more, preferably 0.05 part by weight or more, and more preferably 0.1 part by weight or more, and is usually 1 part by weight or less, preferably 0.5 part by weight or less, and more preferably 0.3 part by weight or less, relative to 100 parts by weight of the polymer as the main component. By using the antioxidant in an amount of the lower limit value or more in the aforementioned range, durability of the resin film can be improved, and even if the antioxidant is used excessively beyond the upper limit, further improvement is difficult to be obtained.

2.4. Other Features of Resin

The glass transition temperature of the resin constituting the resin film is not particularly limited, and is preferably 40° C. or higher, and more preferably 70° C. or higher, and is usually 200° C. or lower, preferably 180° C. or lower, and more preferably 160° C. or lower. When a thermoplastic elastomer containing a block copolymer is used as the resin, the glass transition temperature may be adjusted by changing the weight ratio of each polymer block, whereby the adhesion at the time of sealing the element and flexibility after sealing can be balanced.

The ratio of the resin in the resin film of the present invention is not particularly limited, and may be the remainder other than the other components in the resin film. That is, the component other than the hygroscopic particle, dispersant, and plasticizer in the resin film may be the resin. Such a resin may contain, as previously described, the polymer as a main component, and further contain an optional component such as an antioxidant.

3. Hygroscopic Particle

In the resin film, the hygroscopic particle exists in the state of being dispersed in the resin.

The primary particle diameter of the hygroscopic particle is 40 nm or more and 80 nm or less, and its refractive index is 1.2 or more and 3.0 or less. The primary particle diameter of the hygroscopic particle is preferably 45 nm or more, and more preferably 50 nm or more, and is preferably 70 nm or less, and more preferably 60 nm or less. The refractive index of the hygroscopic particle is preferably 1.3 or more, and more preferably 1.4 or more, and is preferably 2.0 or less, and more preferably 1.7 or less. When such a hygroscopic particle is used together with a specific dispersant, the resin film obtained can have a combination of properties such as high transparency and high surface smoothness as well as low haze.

In the present application, the primary particle diameter represents the number-average particle diameter of primary particles. The primary particle diameter (number-average particle diameter) of the hygroscopic particle may be measured in a state of a dispersion liquid in which the hygroscopic particle is dispersed in a solvent, by a particle diameter measuring device in a dynamic light scattering method. Another measuring method may be a method of shaping a measureent object into a film, directly observing particles in the cross section of the film through an electron microscope, and calculating the average value of the particle diameters.

The hygroscopic particle is a particle of which the weight change ratio when left to stand at 20° C. and 90% RH for 24 hours is as high as a specific value or more. The specific range of the weight change ratio is usually 3% or more, preferably 10% or more, and more preferably 15% or more. The upper limit of the weight change ratio is not particularly limited, and may be, for example, 100% or less. When a hygroscopic particle having such high hygroscopicity is used, moisture can be sufficiently absorbed by a small amount of the hygroscopic particle, and thus, a favorable hygroscopic effect can be exhibited in a small content ratio. When the resin is a thermoplastic elastomer, low ratio of the hygroscopic particle is advantageous because thereby impairment of the rubber property that the thermoplastic elastomer inherently has can be reduced.

The weight change ratio of the hygroscopic particle may be calculated according to the following formula (A1). In the following formula (A1), W1 represents the weight of particles before left to stand under the environment of 20° C. and 90% Rh, and W2 represents the weight of particles after left to stand under the environment of 20° C. and 90% Rh for 24 hours.

$$\text{Weight change ratio (\%)} = ((W2 - W1)/W1) \times 100 \quad (A1)$$

Examples of the material contained in the hygroscopic particle may include: a basic hygroscopic agent such as a compound containing alkali metal, alkali earth metal or aluminum (oxide, hydroxide, salt, or the like) without containing silicon (for example, barium oxide, magnesium oxide, calcium oxide, strontium oxide, aluminum hydroxide, and hydrotalcite), an organometal compound described in Japanese Patent Application Laid-Open No. 2005-298598 A, and clay containing metal oxide; and an acidic hygroscopic agent such as an inorganic compound containing silicon (for example, silica gel, nanoporous silica, and zeolite).

The material of the hygroscopic particle is preferably one or more substances selected from the group consisting of zeolite and hydrotalcite. Zeolite has a particularly high moisture absorption ability, and can easily achieve a high weight change ratio of 10% to 30% when left to stand at 20° C. and 90% RH for 24 hours. Zeolite releases water when dried, and therefore is recyclable. As the materials of the hygroscopic particle, one type thereof may be solely used, and two or more types thereof may also be used in combination at any ratio.

The absolute value of a difference in refractive index between the resin and the hygroscopic particle is preferably small. The value of such an absolute value is preferably 0.05 or less, and more preferably 0.03 or less. When the absolute value of a difference in refractive index between the resin and the hygroscopic particle is within the aforementioned range, internal haze can be decreased, and the resin film can have high transparency.

The refractive index of the hygroscopic particle may be measured by a standard solution method. Specifically, two or three drops of a standard solution reagent with a known refractive index are dropped on a glass substrate plate, and then the hygroscopic particle is mixed therein to prepare a mixed liquid. This operation is performed with standard solution reagents with various refractive indices (Cargille standard refractive index liquids manufactured by Moritex Corporation), and the refractive index of a standard solution reagent with which the mixed liquid turned transparent is adopted as the refractive index of the particle. On the other hand, the refractive index of the resin is measured by molding the resin into a film shape and performing measurement by an Abbe refractometer or a spectroscopic ellipsometer. In the present application, the measurement wavelength of refractive index is 589 nm unless otherwise specified.

The ratio of the hygroscopic particle in the resin film of the present invention is preferably 5% by weight or more, and more preferably 10% by weight or more, and is preferably 60% by weight or less, preferably 40% by weight or less, and more preferably 30% by weight or less. When the ratio of the hygroscopic particle is equal to or more than the aforementioned lower limit value, moisture intrusion prevention effect of the resin film can be improved. When the ratio thereof is equal to or less than the aforementioned upper limit value, transparency, flexibility, and processability of the resin film can be improved.

4. Dispersant

The dispersant in the resin film of the present invention is an organic solvent-soluble dispersant.

In the present application, the organic solvent-soluble dispersant refers to a dispersant capable of achieving a dissolution of 5% by weight or more in an organic solvent. Such dissolution may be tested at a temperature in preparing a mixture that is a material for producing the resin film. The temperature is usually normal temperature (5° C. to 35° C.), and preferably 25° C. In such a condition, if dissolution without leaving a solid precipitate can be achieved, it can be judged that the dispersant is soluble in an organic solvent. As the organic solvent used for the dissolution test, various organic solvents which are used in the production of the resin film and are capable of dissolving the resin can be employed. If the dispersant is soluble in any of these organic solvents, it may be judged that the dispersant is soluble in the organic solvent. The organic solvent used for such judgement may be used in the production of the resin film of the present invention.

When an organic solvent-soluble dispersant is used as the dispersant, the resin film of the present invention can be produced by a producing method with an organic solvent. As a result, a resin film having favorable performance as a sealing film for blocking moisture intrusion can be easily produced.

The dispersant is particularly preferably soluble in a non-polar solvent among organic solvents, and in the production of the resin film of the present invention, it is preferable to use such a non-polar solvent. When a non-polar solvent is adopted in the production of the resin film, the ratio of moisture mixed into the system can be easily reduced, and as a result, a resin film in which the performance of hygroscopic particle is maintained well can be easily obtained.

Examples of substances constituting the organic solvent may include substances which are liquid at normal temperature (preferably 25° C.), other than water and inorganic substances. More specific examples thereof may include cyclohexane, hexane, toluene, benzene, N,N-dimethylformamide, tetrahydrofuran, decahydronaphthalene, trimethylbenzene, methylcyclohexane, ethylcyclohexane, cyclooctane, cyclodecane, normal octane, dodecane, tridecane, tetradecane, cyclododecane, and mixtures thereof. Among these, examples of substances constituting the non-polar solvent may include cyclohexane, hexane, toluene, benzene, decahydronaphthalene, trimethylbenzene, methylcyclohexane, ethylcyclohexane, cyclooctane, cyclodecane, normal octane, dodecane, tridecane, tetradecane, cyclododecane, and mixtures thereof.

The non-polar solvent may contain a polar substance as an optional component as long as the effect of the present invention is not significantly impaired. For example, it may include a polar substance that is well soluble with a non-polar substance. More specifically, it may include substances used as a polar solvent such as N,N-dimethylformamide, tetrahydrofuran, and the like. However, it is preferable that the solvent does not contain water as a polar substance in order to obtain a resin film having good performance as a sealing film. The ratio of the non-polar substance in the non-polar solvent is preferably 95% by weight or more, more preferably 99% by weight or more, even more preferably 99.9% by weight or more, and ideally 100% by weight.

As the organic solvent, cyclohexane is particularly preferable from the viewpoint of high solubility of the resin.

The dispersant has a function of improving the dispersibility of hygroscopic particle in the resin. Examples of the dispersant may include commercially available dispersants such as "ARON (registered trademark)" and "JURYMER (registered trademark)" series from TOAGOSEI CO., LTD., "AQUALIC (registered trademark)" series from Nippon Shokubai Co., Ltd., "FLOWLEN (registered trademark)" series from Kyoeisha Chemical Co., Ltd., "DISPARLON (registered trademark)" series from Kusumoto Chemicals, Ltd., "Sokalan (registered trademark)" series and "EFKA" series from BASF, "DISPERBYK (registered trademark)" and "Anti-Terra" series from BYK Japan KK, "SOL-SPERSE (registered trademark)" series from Lubrisol Japan, and "Ajisupa" series from Ajinomoto Fine-Techno Co., Ltd.

The dispersant may have a group that causes adsorption to the hygroscopic particle and a group that influences the interaction and compatibility between the resin and the solvent.

Examples of a group that causes adsorption to the hygroscopic particle may include an amino group, a carboxyl group, a phosphoric acid group, an amine salt, a carboxylic acid salt, a phosphoric acid salt, an ether group, a hydroxyl group, an amido group, an aromatic vinyl group, and an alkyl group. When the hygroscopic particle is an acidic hygroscopic particle, the group to cause adsorption is preferably basic (a basic dispersant). When the hygroscopic particle is a basic hygroscopic particle, the group to cause adsorption is preferably acidic (an acidic dispersant), but a nonionic dispersant may be used.

The lower limit value of the acid number or basic number (amine number) of the dispersant is preferably 20 mg KOH/g or more, and more preferably 50 mg KOH/g or more. The upper limit value of the acid number or basic number is preferably 200 mg KOH/g or less, and more preferably 160 mg KOH/g or less. When a dispersant having an acid number or basic number (amine number) in these ranges is selected, particles can be efficiently dispersed in a short period of time.

Examples of the group that affects interaction and compatibility between the resin and solvent may include a fatty acid, a polyamine, a polyether, a polyester, a polyurethane, and a polyacrylate.

For example, a silane coupling agent manufactured by Shin-Etsu Silicone Co., Ltd. or Dow Corning Toray Co., Ltd. may be used as the dispersant. In the case of a silane coupling agent, a portion to cause adsorption to the hygroscopic particle is called a hydrolyzable group, and a portion to influence the interaction and compatibility between the resin and the solvent is called a reactive functional group. Examples of the hydrolyzable group may include —$OCH_3$, —$OC_2H_5$, and —$OCOCH_3$. On the other hand, examples of the reactive functional group may include an amino group, an epoxy group, a methacryl group, and a vinyl group. As such a dispersant, one type thereof may be solely used, and a mixture of two or more types thereof may also be used.

The amount of the dispersant is preferably 0.1 part by weight or more, more preferably 7 parts by weight or more, and even more preferably 10 parts by weight or more, and is preferably 1000 parts by weight or less, more preferably 70 parts by weight or less, and even more preferably 50 parts by weight or less, relative to 100 parts by weight of the hygroscopic particle. By setting the amount of the dispersant to be equal to or more than the aforementioned lower limit value, good dispersion of hygroscopic particle can be achieved, and high transparency can be achieved by lowering the internal haze. By setting the amount of the dispersant to be equal to or less than the aforementioned upper limit value, a decrease in adhesion between the resin film and other members caused by the dispersant can be suppressed.

5. Plasticizer

The resin film of the present invention may contain a plasticizer in addition to the resin, hygroscopic particle, and dispersant described above. When the resin film contains the plasticizer, the resin film can have properties such as the glass transition temperature and the elastic modulus being adjusted to desired values.

Suitable examples of the plasticizer may include: a hydrocarbon-based oligomer; an organic acid ester-based plasticizer such as a monobasic organic acid ester and a polybasic organic acid ester; a phosphoric acid ester-based plasticizer such as organophosphoric acid ester-based and organophosphorous acid ester-based plasticizers; and combinations thereof.

The hydrocarbon-based oligomer is preferably one which can be uniformly dissolved or dispersed in the component constituting the resin film. The hydrocarbon-based oligomer is preferably a polymer of a hydrocarbon compound having a molecular weight in a specific range because it does not greatly impair heat resistance and is well dispersed in the components constituting the resin film. The molecular weight of the hydrocarbon-based oligomer as the number-average molecular weight is preferably 200 to 5,000, more preferably 300 to 3,000, and even more preferably 500 to 2,000.

Specific examples of the hydrocarbon-based oligomer may include a polyisobutylene, a polybutene, a poly-4-methylpentene, a poly-1-octene, an ethylene-α-olefin copolymer, a polyisoprene, an alicyclic hydrocarbon, other aliphatic hydrocarbons, an aromatic vinyl compound-conjugated diene copolymer, hydrogenated products of the foregoing compounds, and a hydrogenated product of an indene-styrene copolymer. Among these, a polyisobutylene, a polybutene, a hydrogenated polyisobutylene, and a hydrogenated polybutene are preferable.

The amount of the plasticizer is preferably 1 part by weight or more, more preferably 5 parts by weight or more, and even more preferably 10 parts by weight or more, and is preferably 60 parts by weight or less, and more preferably 50 parts by weight or less, relative to 100 parts by weight of the resin as the main component of the polymer. When the amount of the plasticizer is equal to or more than the aforementioned lower limit, sufficient plasticizing effect can be obtained, and bonding at a low temperature can be easily performed. When the amount of the plasticizer is equal to or less than the aforementioned upper limit and when the amount exceeds the aforementioned weight part, bleed-out of the plasticizer can be suppressed, and the adhesion between the resin film and the object to be bonded (such as a glass plate) can be enhanced.

The absolute value of a difference in refractive index between the resin and the plasticizer is preferably small. The value of such an absolute value is preferably 0.04 or less, and more preferably 0.02 or less. By setting the absolute value of a difference in refractive index between the resin and the plasticizer to fall within the aforementioned range, internal haze can be decreased, and transparency of the hygroscopic resin film can be elevated.

For the case that the plasticizer is solid at normal temperature, the refractive index of the plasticizer may be obtained by preparing a film-shape molded product of the plasticizer and performing measurement at a wavelength of 589 nm by an Abbe refractometer. For the case that the plasticizer is liquid at normal temperature, the plasticizer as it is can be measured at a wavelength of 589 nm by an Abbe refractometer.

6. Performance Etc. of Resin Film

An optional layer may be provided on one or both sides of the resin film of the present invention. That is, a multi-layered product including a resin film and an optional layer may be constituted and the multi-layered product may be served for use. By selecting an appropriate one as the optional layer, the multi-layered product can be made as a product that is advantageous for storage and transport thereof, or for use in a particular use application.

An example of the optional layer may be a release film. Specifically, the resin film may be laminated with a release film to form a multi-layered product. The multi-layered product is preferable when the resin film is used as an adhesive film because the resin film can be easily stored and transported in a multilayer state. Examples of the release film may include a film made of polyethylene terephthalate (PET) having been subjected to a mold release treatment or the like.

The thickness of the resin film of the present invention is preferably 0.1 μm or more, more preferably 1 μm or more, even more preferably 3 μm or more, and particularly preferably 5 μm or more, and is preferably 1000 μm or less, more preferably 100 μm or less, even more preferably 50 μm or less, and particularly preferably 16 μm or less. By setting the thickness of the resin film to be equal to or more than the aforementioned lower limit value, effective moisture absorption can be easily achieved, and thereby suppression of infiltration of moisture can be easily achieved. By setting the thickness of the resin film to be equal to or less than the aforementioned upper limit value, the resin film of the present invention can have good flexibility.

The storage elastic modulus of the resin film of the present invention at 25° C. is preferably $10^7$ Pa or more, and more preferably $2\times10^7$ Pa or more, and is preferably $10^9$ Pa or less, and more preferably $5\times10^8$ Pa or less. By setting the storage elastic modulus of the resin film at 25° C. to fall within the aforementioned range, the resin film can be configured to have rubber elasticity even in a normally operable temperature environment, and can be suitable for a flexible device that requires bending characteristics.

The storage elastic modulus of the resin film at 25° C. may be measured using a dynamic viscoelastic device under the condition of a frequency of 1 Hz.

The internal haze of the resin film of the present invention is preferably 5.0% or less, more preferably 3.0% or less, and particularly preferably 1.0% or less. By setting the internal haze to be equal to or less than the aforementioned range, transparency of the resin film can be increased, and thereby the resin film can be suitably used in a portion where light transmission is required in an organic EL device or the like. The internal haze may be measured by using a turbidity meter. In the measurement of the internal haze, a resin film may be disposed between a pair of glass substrate plates to perform the measurement in a state in which scattering of light on the surface is suppressed. The lower limit of the haze is not particularly limited, and may ideally be 0%.

7. Method for Producing Resin Film

The method for producing the resin film of the present invention is not particularly limited, and the resin film may be produced by an optional method. For example, the resin film may be produced by mixing constituent components (the polymer, hygroscopic particle, dispersant and other components added if necessary) of the resin film to obtain a mixture, applying the mixture onto a substrate, and drying the mixture. Examples of the substrate may include a PET film having been subjected to a mold release treatment. After the resin film has been produced, such a substrate may be used as it is as a release film.

Examples of the method for preparing the mixture may include: a method of melting the polymer and kneading the polymer together with other components by a kneader such as a biaxial kneader, roll, brabender, and extruder; a method of dissolving or dispersing components other than the polymer in an appropriate solvent, and mixing the obtained solution or dispersion liquid and a solution of the polymer; and a method of mixing and dispersing components other than the polymer in a solution of the polymer.

A particularly preferable method for producing the resin film of the present invention may be a method including the following steps A to D.

Step A: a step of dispersing a hygroscopic particle in a solvent 1 to obtain a hygroscopic particle dispersion liquid.

Step B: a step of dissolving a polymer in a solvent 2 to obtain a polymer solution.

Step C: a step of mixing the hygroscopic particle dispersion liquid and the polymer solution to prepare a mixed liquid.

Step D: a step of applying the mixed liquid onto a substrate and drying the liquid.

The solvent 1 used in the step A and the solvent 2 used in the step B are preferably a non-polar solvent. The solvent 2 is preferably a solvent having compatibility with the solvent 1. When the solvent 1 "has compatibility" with the solvent 2, it indicates that these are miscible without phase separation at any ratio at normal temperature.

The solvent 2 may be the same solvent as the solvent 1. Alternatively, the solvent 2 may be a solvent different from the solvent 1. When a non-polar solvent is used as the solvent 1 and the solvent 2, favorable dissolution of the polymer in the mixed liquid can be achieved, and a resin film having favorable properties as a sealing film for blocking moisture intrusion can be easily produced.

The ratio of the hygroscopic particle in the hygroscopic particle dispersion liquid (the step A) may be appropriately adjusted to a ratio suitable for the production. Specifically, the ratio of the hygroscopic particle in the hygroscopic particle dispersion liquid may be 1% by weight to 50% by weight. By setting the ratio of the hygroscopic particle to be equal to or more than 1% by weight, the drying process in the step D can be efficiently performed. By setting the ratio of the hygroscopic particle to be equal to or less than 50% by weight, favorable dispersion of the hygroscopic particle can be easily achieved.

The hygroscopic particle dispersion liquid may include, in addition to the hygroscopic particle and the solvent, a dispersant and another optional component. The dispersant is preferably soluble in the solvent 1. The ratio of the dispersant in the hygroscopic particle dispersion liquid may be adjusted to any optional ratio which allows the achievement of favorable dispersion of the hygroscopic particle. Specifically, the ratio of the dispersant relative to 100 parts by weight of the hygroscopic particle may be 0.1 part by weight to 1000 parts by weight.

The ratio of the polymer in the polymer solution (the step B) is not particularly limited, and may be appropriately adjusted to a ratio suitable for the production. Specifically, the ratio of the polymer in the polymer solution may be 10% by weight to 60% by weight. By setting the ratio of the polymer to be equal to or more than 10% by weight, the drying process in the step D can be efficiently performed. By setting the ratio of the polymer to be equal to or less than 60% by weight, favorable dissolution of the polymer can be easily achieved.

The polymer solution may include an optional component in addition to the polymer and the solvent. Examples of the optional component may include a plasticizer. The ratio of the plasticizer in the polymer solution may be adjusted to any optional ratio which allows the achievement of favorable mechanical properties of the resin film. Specifically, the ratio of the plasticizer relative to 100 parts by weight of the polymer may be 5 parts by weight to 60 parts by weight.

The specific operation for preparing the hygroscopic particle dispersion liquid in the step A is not particularly limited, and may include mixing constituent components of the hygroscopic particle dispersion liquid by any optional method. Examples of a mixing device may include a mixing and dispersing device such as a bead mill, a ball mill, a high pressure homogenizer, and a wet jet mill. The preparation of the polymer solution in the step B may be performed in the same manner by mixing constituent components of the polymer solution by any optional method.

The mixing ratios of the hygroscopic particle dispersion liquid and the polymer solution in the step C may be any optional ratio at which a desired product can be obtained. For example, when the respective ratios of the components in the hygroscopic particle dispersion liquid and the polymer solution are adjusted, desired ratios of the components can be obtained by mixing equal amounts of the hygroscopic particle dispersion liquid and the polymer solution.

The substrate to be used in the step D may be any optional member that can support the layer of the mixed liquid. Examples of the substrate may include a PET film having been subjected to a mold release treatment. After the resin film has been produced, such a substrate may be used as it is as a release film.

The application of the mixed liquid onto a substrate in the step D may be performed using a known coating applicator or the like. The coating thickness may be appropriately adjusted to a thickness with which a resin film having a desired thickness can be obtained.

The drying of the layer of the mixed liquid in the step D may be performed by warming the substrate and the layer of the mixed liquid using a warming device such as a hot plate and an oven. The temperature for warming may be appropriately adjusted to a temperature suitable for volatilizing the solvent in the mixed liquid and obtaining a desired resin film. Specifically, the temperature for warming may be 80 to 150° C.

The steps A to C and the process to application in the step D may be performed at normal temperature, and the drying process in the step D may be performed at the previously-described relatively low temperature. When such processes are adopted, production with little foaming from the hygroscopic particle can be easily achieved.

Through the step D, the layer of the mixed liquid can be cured, and thereby the resin film is obtained as a layer disposed on the substrate. The obtained resin film may be peeled from the substrate as necessary before use.

8. Use Application of Resin Film

The resin film of the present invention may be used for use applications such as a supporting substrate, insulation, adhesion, and sealing in electronic devices. Examples of electronic devices may include an organic EL device, a solar cell, a touch panel, and various electrodes (ITO, copper electrode, tin electrode, solder electrode, and the like). When used for adhesion (an adhesive layer) among these use applications, the resin film of the present invention is placed between two layers to be bonded, and subjected to a treatment for exhibiting adhesion, so that the two layers to be bonded are bonded to each other.

The treatment for exhibiting adhesion may be specifically a so-called hot melt treatment. That is, the resin film of the present invention may be heated, and further subjected to a treatment of adding pressure between two layers to be bonded if necessary. The treatment temperature is preferably Tg or higher, and more preferably (Tg+10)° C. or higher. As described herein, Tg represents the glass transition temperature of the constituent resin of the resin film. When the resin has a plurality of glass transition temperatures, the Tg represents the highest glass transition temperature. This can achieve favorable adhesion. The upper limit of the treatment temperature is preferably (Tg+50)° C. or lower, and more preferably (Tg+30)° C. or lower. When the treatment is performed at a temperature of the upper limit or lower, moving of the hygroscopic particle and the dispersant to the outermost surface of the resin film can be effectively suppressed. As a result, a chemical reaction between the hygroscopic particle and the like and the layers to be bonded can be suppressed, and physical adverse effects by the secondary particles of the hygroscopic particle can also be suppressed.

9. Organic EL Device

A particularly preferable use application of the resin film of the present invention may be an organic EL device. Hereinafter, this device will be explained as the organic EL device of the present invention.

The organic EL device of the present invention includes the aforementioned resin film of the present invention. In the organic EL device of the present invention, the resin film may be provided as a sealing film. When the resin film of the present invention is used as a sealing film, moisture intrusion prevention effect can be effectively exhibited in the organic EL device which is susceptible to moisture and oxygen.

The organic EL device may include a substrate plate, and an electrode and a light-emitting layer disposed thereon. Specifically, the organic EL device may include a substrate plate such as a glass plate, a first electrode disposed thereon, a light-emitting layer disposed thereon, and a second electrode disposed thereon. When one of the first electrode and the second electrode is provided as a transparent electrode, and the other is provided as a reflective electrode (or a combination of a transparent electrode and a reflective layer), light can be emitted to the transparent electrode side in response to the application of electricity to the electrodes.

The organic EL device may further include a gas barrier layer for suppressing infiltration of moisture into the light-emitting layer. The organic EL device may include a substrate plate, and a gas barrier layer as well as an electrode and a light-emitting layer disposed therebetween, and may have a structure in which the substrate plate and the gas barrier layer seal the electrode and the light-emitting layer. The organic EL device may include the resin film of the present invention as a layer placed between the second electrode and the gas barrier layer. With such a configuration in which the resin film of the present invention functions as an adhesive layer for bonding the second electrode and the gas barrier layer, there can be obtained an organic EL device in which moisture intrusion into a layer such as the light-emitting layer is prevented through high adherence, so that layers such as the light-emitting layer can be effectively sealed.

The gas barrier layer included in the organic EL device may be a layered body of the resin film and a gas barrier layer. For example, a gas barrier layered body including the resin film and an inorganic barrier layer formed thereon may be used as a gas barrier layer.

Preferable examples of the inorganic material that may be contained in the inorganic barrier layer may include: metal; an oxide, nitride, or nitride oxide of silicon; an oxide, nitride, or nitride oxide of aluminum; DLC (diamond-like carbon); and a mixed material containing two or more thereof. Among these, in terms of transparency, a material containing silicon is preferable, and a silicon oxide and a silicon nitride oxide are particularly preferable. In terms of compatibility with the resin film, DLC is particularly preferable.

An example of the oxide of silicon may be $SiO_x$. Herein, x is preferably $1.4<x<2.0$ from the viewpoint of achieving both the transparency and water vapor barrier property of the inorganic barrier layer. Another example of the oxide of silicon may be SiOC.

Examples of the nitride of silicon may include $SiN_y$. Herein, y is preferably $0.5<y<1.5$ from the viewpoint of achieving both the transparency and water vapor barrier property of the inorganic barrier layer.

Examples of the nitride oxide of silicon may include $SiO_pN_q$. Herein, when it is important to improve the adherence of the inorganic barrier layer, p and q are preferably $1<p<2.0$ and $0<q<1.0$, respectively, so that the inorganic barrier layer is obtained as an oxygen-rich film. When it is important to improve the water vapor barrier property of the inorganic barrier layer, p and q are preferably $0<p<0.8$ and $0.8<q<1.3$, respectively, so that the inorganic barrier layer is obtained as a nitrogen-rich film.

Examples of the oxide, nitride and nitride oxide of aluminum may include $AlO_x$, $AlN_y$, and $AlO_pN_q$. Among these, from the viewpoint of the inorganic barrier property, $SiO_pN_q$ and $AlO_x$ as well as a mixture thereof are particularly preferable.

The inorganic barrier layer may be formed, e.g., on the surface of the resin film to serve as a support body, by a film forming method such as a vapor deposition method, a sputtering method, an ion plating method, an ion beam assisted vapor deposition method, an arc discharge plasma vapor deposition method, a thermal CVD method, and a plasma CVD method. Among these, a chemical vapor deposition method such as a thermal CVD method and a plasma CVD method is preferably used. According to a chemical vapor deposition method, by the adjustment of a gas component used in film forming, an inorganic barrier layer having flexibility can be formed. Formation of such a flexible inorganic barrier layer can enable the inorganic barrier layer to follow the deformation of the resin film and the size change of the resin film under high temperature and high humidity environment. Furthermore, according to a chemical vapor deposition method, a film can be formed at a high film forming rate under low vacuum environment, and a favorable gas barrier property can be achieved.

In the gas barrier layered body, the inorganic barrier layer may be disposed on both surfaces of the resin film, but is usually disposed on one surface. When disposed on one surface, the inorganic barrier layer may face the inside or the outside of the organic EL device. From the viewpoint of preventing the damage of the inorganic barrier layer after the device has been produced, the inorganic barrier layer preferably faces the inside of the organic EL device.

The organic EL device may further include an optional layer such as a hole injection layer, a hole transport layer, an electron transport layer, and an electron injection layer, between the first electrode and the second electrode. The organic EL device may include an optional configuration such as wiring for applying electricity to the first electrode and the second electrode, and a peripheral structure for sealing the light-emitting layer.

The organic EL device may include the light-emitting layer in any optional manner. For example, the organic EL device of the present invention may be a display device having the light-emitting layer as pixels for displaying an image, or a light source device such as a backlight device and a lighting device having the light-emitting layer as a light-emitting body for supplying light.

EXAMPLES

Hereinafter, the present invention will be specifically described by illustrating Examples. However, the present invention is not limited to the Examples described below. The present invention may be optionally modified for implementation without departing from the scope of claims of the present invention and its equivalents. In the following description, "%" and "part" representing quantity are on the basis of weight, unless otherwise specified. The following operations were performed at normal temperature and under normal pressure, unless otherwise specified.

Evaluation Method

Young's Modulus, Tensile Elongation and tan δ of Resin

The Young's modulus and tensile elongation of the resin at 23° C. were measured in accordance with JIS K7113. The loss tangent tan δ (loss modulus/storage modulus) at 40° C. or higher and 200° C. or lower of a resin was measured by shaping the resin into a film, cutting the film into a test piece of 10 mm in width×20 mm in length, and using a DMS6100 dynamic viscoelasticity measuring device manufactured by Hitachi High-Tech Science Corporation.

Refractive Index

The refractive index of the hygroscopic particle was measured by a standard solution method. Specifically, two or three drops of a standard solution reagent with a known refractive index were dropped on a glass substrate plate, and then the hygroscopic particle was mixed therein to prepare a mixed liquid. This operation was performed with each of standard solution reagents with various refractive indices (Cargille standard refractive index liquids manufactured by Moritex Corporation), and the refractive index of a standard solution reagent with which the mixed liquid turned transparent was adopted as the refractive index of the particle.

The refractive index of the resin was obtained by preparing a film-shape molded product of the resin, and performing measurement at a wavelength of 589 nm by an Abbe refractometer.

The refractive index of the plasticizer was measured as it is at a wavelength of 589 nm by an Abbe refractometer.

Method for Measuring Storage Elastic Modulus of Resin Film

From the multi-layered product prepared in each of Examples and Comparative Examples, the PET film was peeled to obtain a resin film. The storage elastic modulus of the resin film at 25° C. was measured under the condition of a frequency of 1 Hz, using a DMS6100 dynamic viscoelasticity measuring device manufactured by Hitachi High-Tech Science Corporation.

Internal Haze

A pair of 5 cm-square glass substrate plates was prepared. From the multi-layered product obtained in each of Examples and Comparative Examples, the PET film was peeled to obtain a resin film. The resin film was disposed between the pair of glass substrate plates to obtain a sample having the layer configuration of (glass substrate plate)/(resin film)/(glass substrate plate). The sample was passed through a roll laminator for a pressurization treatment. The pressurization condition was a roll temperature of 110° C. and a roll laminator pressure of 0.3 MPa. After the pressurization treatment, the internal haze of the sample was measured using a turbidimeter ("NDH-2000" manufactured by Nippon Denshoku Industries Co., Ltd).

Production Example 1

P1-1. Production of Hydrogenated Block Copolymer

A hydrogenated product of a block copolymer (hydrogenated block copolymer) having a triblock structure, in which polymer blocks [A] were bonded to both ends of a polymer block [B], was produced with styrene as an aromatic vinyl compound and isoprene as a chain conjugated diene compound, in the following procedure.

Into a reaction vessel equipped with a stirrer, inside which the atmosphere was sufficiently substituted with nitrogen, 256 parts of dehydrated cyclohexane, 25.0 parts of dehydratedstyrene, and 0.615 part of n-dibutyl ether were poured. While the mixture was stirred at 60° C., 1.35 parts of n-butyl lithium (a 15% cyclohexane solution) was added to initiate polymerization. The reaction continued under stirring at 60° C. for 60 minutes. The polymerization conversion ratio at this point was 99.5%. (Polymerization conversion ratio was measured by gas chromatography. The same applies hereinafter.)

Subsequently, 50.0 parts of dehydrated isoprene was added, and the mixture was continuously stirred at the same temperature for 30 minutes. The polymerization conversion ratio at this point was 99%.

After that, 25.0 parts of dehydrated styrene was further added, and the mixture was stirred at the same temperature for 60 minutes. The polymerization conversion ratio at this point was almost 100%.

Subsequently, 0.5 part of isopropyl alcohol was added to the reaction liquid to terminate the reaction, thereby to obtain a solution (i) containing a block copolymer.

The weight-average molecular weight (Mw) of the block copolymer in the obtained solution (i) was 44,900, and the molecular weight distribution (Mw/Mn) was 1.03.

Subsequently, the solution (i) was transferred to a pressure resistant reaction vessel equipped with a stirrer, and 4.0 parts of a silica-alumina carried nickel catalyst (E22U, carried nickel amount 60%; manufactured by Nikki Chemicals Co.) as a hydrogenation catalyst and 350 parts of dehydrated cyclohexane were added to the solution (i) and mixed. The block copolymer was hydrogenated by substituting the inside of the reaction vessel with hydrogen gas, and further supplying hydrogen while stirring the solution to perform a hydrogenation reaction at a temperature of 170° C. and a pressure of 4.5 MPa for 6 hours, thereby to obtain a solution (iii) containing a hydrogenated product (ii) of the block copolymer. The weight-average molecular weight (Mw) of the hydrogenated product (ii) in the solution (iii) was 45,100, and the molecular weight distribution (Mw/Mn) was 1.04.

After the termination of the hydrogenation reaction, the solution (iii) was filtered to remove the hydrogenation catalyst. After that, to the filtered solution (iii), 1.0 part of a xylene solution, in which 0.1 part of 6-[3-(3-t-butyl-4-hydroxy-5-methylphenyl)propoxy]-2,4,8,10-tetrakis-t-butyldibenzo[d,f][1.3.2]dioxaphosphepin ("Sumilizer (registered trademark) GP" manufactured by Sumitomo Chemical Company, Limited, hereinafter referred to as an "antioxidant A") as a phosphorus-based antioxidant was dissolved, was added and dissolved, thereby to obtain a solution (iv).

Subsequently, the solution (iv) was filtered through a Zeta-plus (registered trademark) 30H filter (manufactured by Cuno, Inc., pore diameter 0.5 μm to 1 μm), and successively filtered through another metal fiber filter (pore diameter 0.4 μm, manufactured by Nichidai Corporation) to remove minute solid content. From the filtered solution (iv), the solvents cyclohexane and xylene as well as other volatile matters were removed at a temperature of 260° C. and a pressure of 0.001 MPa or less, using a cylindrical concentration dryer (product name "Kontro", manufactured by Hitachi, Ltd.). Then, through a die directly connected to the aforementioned concentration dryer, the solid content was extruded in a molten state into a strand shape. The extruded product was cooled, and cut by a pelletizer to obtain 85 parts of a pellet (v) containing a hydrogenated product of the block copolymer and the antioxidant A. The weight-average molecular weight (Mw) of the hydrogenated product of the block copolymer (hydrogenated block copolymer) in the obtained pellet (v) was 45,000, and the molecular weight distribution (Mw/Mn) was 1.08. The hydrogenation rate was 99.9%.

P1-2. Production of Silane Modified Product of Hydrogenated Block Copolymer

To 100 parts of the pellet (v) obtained in (P1-1), 2.0 parts of vinyltrimethoxysilane and 0.2 part of di-t-butyl peroxide were added to obtain a mixture. This mixture was kneaded in a twin-screw extruder at a barrel temperature of 210° C. and a retention time of 80 seconds to 90 seconds. The kneaded mixture was extruded, and cut by a pelletizer to obtain a pellet (vi) of a silane modified product of the hydrogenated block copolymer. A film-shape test piece was produced from this pellet (vi). The glass transition temperature Tg of the test piece was evaluated by the tan δ peak of a dynamic viscoelasticity measuring device and found to be 124° C. The peak value of tan δ in a range of 40° C. or higher and 200° C. or lower of this pellet (vi) was 1.3. This pellet (vi) had a Young's modulus at 23° C. of 0.5 GPa and a tensile elongation of 550%. The refractive index (n1) of this pellet (vi) measured by an Abbe refractometer was 1.50.

Example 1

1-1. Hygroscopic Particle Dispersion Liquid

In a bead mill, 10 g of zeolite particles (refractive index 1.5) having a number-average primary particle diameter of 50 nm, 4 g of a dispersant having a basic adsorptive group (hydroxyl group-containing carboxylic acid ester, trade name "DISPERBYK 108" manufactured by BYK Japan KK, the same applies hereinafter), and 186 g of cyclohexane were mixed and dispersed. By this operation, a 5% zeolite dispersion liquid was prepared.

1-2. Polymer Solution

To 164 g of cyclohexane, 25.2 g of the pellet (vi) obtained in Production Example 1 and 10.8 g of a plasticizer (a plasticizer containing an aliphatic hydrocarbon polymer, trade name Nisseki Polybutene LV-100, manufactured by Nippon Oil Corporation, refractive index 1.50, number-average molecular weight 500, the same applies hereinafter) were added and dissolved. By this operation, a polymer solution with a solid content of 18% was prepared.

1-3. Resin Film

The zeolite dispersion liquid obtained in (1-1) and the polymer solution obtained in (1-2) were equally weighed, and mixed to prepare a mixed liquid. The mixed liquid was applied onto a PET film (mold release-treated PET film, trade name MRV38, manufactured by Mitsubishi Plastics Inc., the same applies hereinafter) using an applicator, and dried by a hot plate at 110° C. for 3 minutes. By this operation, a multi-layered product that included a PET film and a resin film formed thereon was obtained. The resin film in the multi-layered product had a thickness of 10 μm, and contained 20% of zeolite particles dispersed therein. The resin film contained no aggregates, and had a favorable surface state. The internal haze of the resin film in the multi-layered product was measured and found to be 0.7%. The storage elastic modulus of the resin film was $9 \times 10^7$ Pa.

Example 2

2-1. Hygroscopic Particle Dispersion Liquid

In a bead mill, 10 g of hydrotalcite particles (refractive index 1.52) having a number-average primary particle diameter of 60 nm, 1.5 g of a dispersant having an acidic adsorptive group (trade name "SOLSPERSE 3000", manufactured by Lubrizol Japan, the same applies hereinafter), and 188.5 g of cyclohexane were mixed and dispersed. By this operation, a 5% hydrotalcite dispersion liquid was prepared.

2-2. Polymer Solution

To 161.5 g of cyclohexane, 27 g of the pellet (vi) obtained in Production Example 1 and 11.6 g of a plasticizer were mixed and dissolved. By this operation, a polymer solution with a solid content of 19.4% was prepared.

2-3. Resin Film

The hydrotalcite dispersion liquid obtained in (2-1) and the polymer solution obtained in (2-2) were equally weighed, and mixed to prepare a mixed liquid. The mixed liquid was applied onto a PET film using an applicator, and dried by a hot plate at 110° C. for 3 minutes. By this operation, a multi-layered product that included a PET film and a resin film formed thereon was obtained. The resin film in the multi-layered product had a thickness of 10 μm, and contained 20% of hydrotalcite particles dispersed therein. The resin film contained no aggregates, and had a favorable surface state. The internal haze of the resin film in the multi-layered product was measured and found to be 0.8%. The storage elastic modulus of the resin film was $9 \times 10^7$ Pa.

Comparative Example 1

C1-1. Hygroscopic Particle Dispersion Liquid

In a bead mill, 10 g of zeolite particles having a number-average primary particle diameter of 100 nm, 10 g of a dispersant having a basic adsorptive group, and 180 g of cyclohexane were mixed and dispersed. By this operation, a 5% zeolite dispersion liquid was prepared.

C1-2. Polymer Solution

To 170 g of cyclohexane, 21 g of the pellet (vi) obtained in Production Example 1 and 9 g of a plasticizer were mixed and dissolved. By this operation, a polymer solution with a solid content of 15% was prepared.

C1-3. Resin Film

The zeolite dispersion liquid obtained in (C1-1) and the polymer solution obtained in (C1-2) were equally weighed, and mixed to prepare a mixed liquid. The mixed liquid was applied onto a PET film using an applicator, and dried by a hot plate at 110° C. for 3 minutes. By this operation, a multi-layered product that included a PET film and a resin film formed thereon was obtained. The resin film in the multi-layered product had a thickness of 10 μm, and contained 20% of zeolite particles dispersed therein. The resin film contained no aggregates, and had a favorable surface state. The internal haze of the resin film in the multi-layered product was measured and found to be 1.2%, which was inappropriate as an optical film. The storage elastic modulus of the resin film was $6 \times 10^7$ Pa.

Comparative Example 2

C2-1. Hygroscopic Particle Dispersion Liquid

In a bead mill, 10 g of magnesium oxide particles having a number-average primary particle diameter of 20 nm, 10 g of a dispersant having a basic adsorptive group, and 180 g of cyclohexane were mixed and dispersed. By this operation, a 5% magnesium oxide dispersion liquid was prepared.

C2-2. Polymer Solution

To 160 g of cyclohexane, 28 g of the pellet (vi) obtained in Production Example 1 and 12 g of a plasticizer were mixed and dissolved. By this operation, a polymer solution with a solid content of 20% was prepared.

C2-3. Resin Film

The magnesium oxide dispersion liquid obtained in (C2-1) and the polymer solution obtained in (C2-2) were weighed at a ratio of 1:2, and mixed to prepare a mixed liquid. The mixed liquid was applied onto a PET film using an applicator, and dried by a hot plate at 110° C. for 3 minutes. By this operation, a multi-layered product that included a PET film and a resin film formed thereon was obtained. The resin film in the multi-layered product had a thickness of 10 μm, and contained 10% of magnesium oxide particles dispersed therein. The resin film contained aggregates, and had a rugged surface state. The internal haze of the resin film in the multi-layered product was measured and found to be 28%, which was inappropriate as an optical film. The storage elastic modulus of the resin film was $8 \times 10^7$ Pa.

The results of Examples and Comparative Examples were collectively shown in Table 1.

TABLE 1

|  | Ex. 1 | Ex. 2 | Comp. Ex. 1 | Comp. Ex. 2 |
|---|---|---|---|---|
| Dispersant type | Basic | Acidic | Basic | Basic |
| Hygroscopic particle type, content and refractive index | Zeolite 20% 1.5 | Hydrotalcite 20% 1.52 | Zeolite 20% 1.5 | MgO 10% 2.0 |
| Hygroscopic particle diameter | 50 nm | 60 nm | 100 nm | 20 nm |
| Dispersant ratio relative to 100 parts by weight of hygroscopic particles | 40 parts by weight | 15 parts by weight | 100 parts by weight | 100 parts by weight |
| Resin film thickness | 10 μm | 10 μm | 10 μm | 10 μm |
| Internal haze | 0.7% | 0.8% | 1.2% NG | 28% NG |
| Surface state | Good | Good | Good | Poor |
| Resin film storage elastic modulus Pa | $9 \times 10^7$ | $9 \times 10^7$ | $6 \times 10^7$ | $8 \times 10^7$ |

Reference Example

To 95 parts by weight of cyclohexane, either one of 5 parts by weight of a dispersant having a basic adsorptive group and 5 parts by weight of a dispersant having an acid adsorptive group was dissolved at 25° C., and it was found that each of them was dissolved without remaining solid sediment.

As understood from the results of Examples and Comparative Examples, the resin film of the present invention, which includes a specific hygroscopic particle and a specific dispersant in addition to the resin, can have low internal haze and achieve a favorable surface state, compared to the resin films of Comparative Examples, in which the particle diameter of the hygroscopic particle is outside the range defined in the present invention.

The invention claimed is:

1. A resin film comprising: a resin containing a polymer; a hygroscopic particle dispersed in the resin and having a primary particle diameter of 40 nm or more and 80 nm or less and a refractive index of 1.2 or more and 3.0 or less; and an organic solvent-soluble dispersant, wherein the hygroscopic particle is a hydrotalcite particle and the dispersant is a dispersant having an acidic adsorptive group, or the hygroscopic particle is a zeolite particle and the dispersant is a dispersant having a basic adsorptive group.

2. The resin film according to claim 1, wherein the resin is a silicon-containing resin.

3. The resin film according to claim 2, wherein the silicon-containing resin is a silicon-containing thermoplastic resin.

4. The resin film according to claim 3, wherein the silicon-containing thermoplastic resin is a silicon-containing thermoplastic elastomer.

5. The resin film according to claim 4, wherein the silicon-containing thermoplastic elastomer contains a graft polymer having a silicon-containing group as the polymer.

6. The resin film according to claim 5, wherein the polymer has a structure obtained by graft polymerization of a monomer having a silicon-containing group and a copolymer selected from the group consisting of a styrene-butadiene block copolymer, a styrene-butadiene-styrene block copolymer, a styrene-isoprene block copolymer, a styrene-isoprene-styrene block copolymer, a hydrogenated product thereof, and a mixture thereof.

7. The resin film according to claim 1, further comprising a plasticizer.

8. The resin film according to claim 1, wherein the storage elastic modulus thereof at 25° C. is $10^7$ Pa or more and $10^9$ Pa or less.

9. The resin film according to claim 1, wherein the thickness thereof is 0.1 μm or more and 1000 μm or less.

10. The resin film according to claim 1, wherein the internal haze thereof is 5.0% or less.

11. An organic electroluminescent device comprising the resin film according to claim 1.

12. The resin film according to claim 1, wherein the absolute value of a difference in refractive index between the resin and the hygroscopic particle is 0.05 or less, and an amount of the dispersant is 0.1 parts by weight or more and 70 parts by weight or less relative to 100 parts by weight of the hygroscopic particle.

* * * * *